(12) United States Patent
Chen

(10) Patent No.: US 11,515,452 B2
(45) Date of Patent: Nov. 29, 2022

(54) LED CHIP, LED ARRAY AND LED PACKAGING METHOD

(71) Applicant: CHONGQING KONKA PHOTOELECTRIC TECHNOLOGY RESEARCH INSTITUTE CO., LTD., Chongqing (CN)

(72) Inventor: Ching-Chung Chen, Chongqing (CN)

(73) Assignee: CHONGQING KONKA PHOTOELECTRIC TECHNOLOGY RESEARCH, Chongqing (CN)

( * ) Notice: Subject to any disclaimer, the term of this patent is extended or adjusted under 35 U.S.C. 154(b) by 33 days.

(21) Appl. No.: 17/256,145

(22) PCT Filed: Sep. 9, 2019

(86) PCT No.: PCT/CN2019/104947
§ 371 (c)(1),
(2) Date: Dec. 24, 2020

(87) PCT Pub. No.: WO2021/046685
PCT Pub. Date: Mar. 18, 2021

(65) Prior Publication Data
US 2021/0367110 A1 Nov. 25, 2021

(51) Int. Cl.
*H01L 33/46* (2010.01)
*H01L 25/075* (2006.01)
(Continued)

(52) U.S. Cl.
CPC .......... *H01L 33/46* (2013.01); *H01L 25/0753* (2013.01); *H01L 33/32* (2013.01); *H01L 33/62* (2013.01); *H01L 2933/0025* (2013.01)

(58) Field of Classification Search
CPC ..... H01L 33/46; H01L 33/32; H01L 25/0753; H01L 2933/0025
See application file for complete search history.

(56) References Cited

U.S. PATENT DOCUMENTS 6,969,874 B1   11/2005  Gee et al.
2005/0281303 A1*  12/2005  Horio ................... H01L 33/08
                                                                372/50.1
(Continued)

FOREIGN PATENT DOCUMENTS

CN    103904180 A    7/2014
CN    103972346 A    8/2014
(Continued)

OTHER PUBLICATIONS

World Intellectual Property Organization (WIPO) International Search Report for PCT/CN2019/104947 dated May 28, 2020 11 Pages.

*Primary Examiner* — Feifei Yeung Lopez
(74) *Attorney, Agent, or Firm* — Anova Law Group, PLLC

(57) ABSTRACT

The disclosure relates to an LED chip, an LED array and an LED packaging method. By adding a reflecting layer on the periphery of the LED, the reflecting layer adjusts the emission direction of light emitted by a light-emitting layer of the LED, so that the adjusted emission direction is more concentrated to a certain required illumination direction, and the light emitted by the light-emitting layer is prevented from irradiating adjacent LEDs and thereby causing interference to the adjacent LEDs. Therefore, according to the method provided by the disclosure, the light field directivity of the emitted light beam is improved, the embodiment is easy to operate with convenient implementation and improved LED performance, providing convenience for a user to use an LED lamp.

7 Claims, 3 Drawing Sheets

(51) Int. Cl.
*H01L 33/32* (2010.01)
*H01L 33/62* (2010.01)

(56) References Cited

U.S. PATENT DOCUMENTS

2009/0267096 A1* 10/2009 Kim .................... H01L 33/0093
257/98
2016/0118543 A1* 4/2016 Lim ....................... H01L 33/42
257/98
2019/0237626 A1* 8/2019 Yoon ....................... H01L 33/46

FOREIGN PATENT DOCUMENTS

| CN | 105977353 A | 9/2016 |
| CN | 205692852 U | 11/2016 |
| CN | 107634129 A | 1/2018 |
| CN | 208637452 U | 3/2019 |
| CN | 111201618 A | 5/2020 |

* cited by examiner

LED CHIP, LED ARRAY AND LED PACKAGING METHOD

CROSS-REFERENCE TO RELATED APPLICATION

This application is a national stage application of PCT Patent Application No. PCT/CN2019/104947, filed on Sep. 9, 2019, the content of all of which is incorporated herein by reference.

TECHNICAL FIELD

The disclosure relates to the technical field of lighting equipment, in particular to an LED chip, an LED, an LED array and an LED packaging method.

BACKGROUND

Light-emitting diode, which is called LED for short, is a kind of semiconductor component, and is a kind of lighting equipment which converts electric energy into light energy. The light-emitting diode is manufactured by utilizing the principle that visible light can be radiated when electrons and holes are combined. LEDs may be used as indicator lights, or to compose numeric, alphabetic, or textual displays. For example, semiconductor materials are combined with other elements to produce semiconductor layers for emitting green, blue, or white lights by using the semiconductor materials having high thermal stability and a wide band gap.

In general, light beams emitted by LEDs are uniformly emitted from the interior of an LED chip. However, in order to avoid mutual interference of light beams emitted by a plurality of adjacent LEDs, the LEDs, as backlight sources of a plurality of displays, often need better light field directivity. In the prior art, the light field directivity of the LEDs is usually achieved by luminance or current control of the LEDs. However, the current control of the LEDs often needs to be matched with the design of a circuit board or a carrier board of which the structure is complex and the manufacturing process cost is high.

Accordingly, there remains a need in the art for improvements and developments.

BRIEF SUMMARY

The disclosure is directed to solve the technical problems that aiming at the defects in the prior art, the disclosure provides an LED chip, an LED, an LED array and an LED packaging method for solving the problems of poor light field directivity, divergent emitted lights, and light interference between adjacent LEDs caused by emitted light divergence in the LED array in the prior art.

The technical scheme adopted by the disclosure for solving the technical problem is as follows:

In a first aspect, the present embodiment provides an LED chip, which comprises an LED chip body and a reflecting layer coated on a side edge surface of the LED chip body.

Optionally, the LED chip body comprises a first semiconductor layer, a second semiconductor layer disposed over the first semiconductor layer, and a light-emitting layer disposed between the first semiconductor layer and the second semiconductor layer; the reflecting layer is coated on a side edge surface of the second semiconductor layer.

Optionally, the first semiconductor layer is an N-type semiconductor layer, the second semiconductor layer is a P-type semiconductor layer, and an N electrode is disposed on the N-type semiconductor layer; and the reflecting layer is also coated on a side edge surface of the N electrode.

Optionally, one side edge surface of the N electrode is connected to one side edge surface of the P-type semiconductor layer, and the P-type semiconductor layer is coated on other side edge surfaces of the N electrode.

Optionally, a height of the reflecting layer is less than or equal to ½ of a value of a distance between a top of the second semiconductor layer and a bottom of the first semiconductor layer.

Optionally, a side edge shape of the structure formed by the first semiconductor layer and the second semiconductor layer is trapezoid.

Optionally, a material of the first semiconductor layer is an N-type gallium nitride material, and a material of the second semiconductor layer is a P-type gallium nitride material.

In a second aspect, the embodiment also discloses an LED, which comprises the LED chip described above.

In a third aspect, the embodiment also discloses an LED packaging method, which comprises covering an outer surface of the side edge of the second semiconductor layer of each LED by using the reflecting layer.

In a fourth aspect, the embodiment also discloses an LED array, which comprises a circuit board and a plurality of the LEDs mounted on the circuit board.

Optionally, a distance between any one of the LEDs and an adjacent LED is inversely proportional to the height of the reflecting layer wrapped on the LED chip body.

Compared with the prior art, the embodiment of the disclosure has the following advantages:

According to the LED chip, the LED, the LED array and the LED packaging method provided by the embodiment of the disclosure, by adding a reflecting layer on the periphery of the LED chip body, the reflecting layer can adjust the emission direction of light emitted by the light-emitting layer of the LED chip, so that the adjusted emission direction is more concentrated to a certain required illumination direction, and the light emitted by the light-emitting layer is prevented from irradiating adjacent LEDs and thereby causing interference to the adjacent LEDs. Therefore, according to the method provided by the disclosure, the light field directivity of the emitted light beam is improved, the embodiment is easy to operate with convenient implementation, providing convenience for improving LED performance.

DETAILED DESCRIPTION OF EMBODIMENTS

In order that the objects, technical solutions, and advantages of the present disclosure will become more apparent and clear, the present disclosure will be described in further detail hereinafter with reference to the accompanying drawings and giving embodiments. It is to be understood that the specific embodiments described herein are merely illustrative of the present disclosure and are not intended to limit the present disclosure.

As LEDs in the prior art are commonly used as a light source of an information communication device besides common lighting equipment, when the LEDs are used, if the light beams emitted by the LEDs are too divergent, the requirements of a user cannot be met when the user needs strong illumination light in a certain direction, and the LEDs are generally used as lighting equipment in the form of an LED array or an LED lattice for providing the illumination function. If the light-emitting directivity of each LED is weak, mutual interference between each LED is serious, and high-quality light sources cannot be provided. For example, if a backlight source with high luminance is required to be provided, each LED is required to have good light field directivity, so that light beams emitted by each LED can point to the direction of required illumination, and unnecessary light loss is avoided.

Embodiment 1

The embodiment provides an LED chip comprising an LED chip body and a reflecting layer coated on a side edge surface of the LED chip body.

The LED chip body comprises a first semiconductor layer, a second semiconductor layer disposed over the first semiconductor layer, and a light-emitting layer disposed between the first semiconductor layer and the second semiconductor layer.

The reflecting layer is coated on a side edge surface of the first semiconductor layer.

Figure 1:
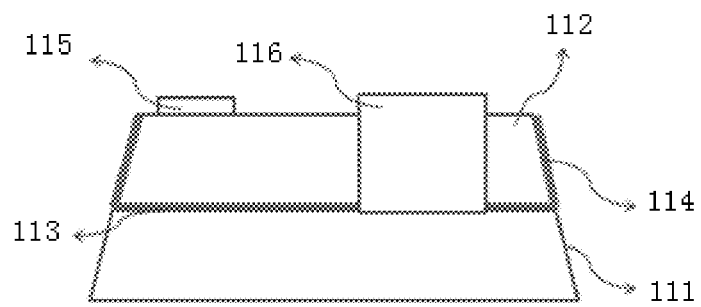
FIG. 1 is a first side view of an LED chip in an embodiment of the present disclosure.

As shown in FIG. 1, the first semiconductor layer is an N-type semiconductor layer 111, the second semiconductor layer is a P-type semiconductor layer 112, and the both are connected to form a P-N structure. Light is emitted by injecting electrons into the P-N using an external power source. Disposed between the P-type semiconductor layer 112 and the N-type semiconductor layer 111 is a light-emitting layer 113, that is, an active layer, which is made of a double heterostructure. An N electrode 116 is disposed on the N-type semiconductor layer 111; the reflecting layer 114 is also coated on an outer surface of the side edge of the N electrode 116.

A donor impurity is doped into the semiconductor material to obtain an N-type semiconductor layer, an acceptor impurity is doped into the semiconductor material to obtain a P-type semiconductor layer, and the N-type semiconductor layer and the P-type semiconductor layer can form an unijunction semiconductor element, namely a light-emitting diode.

In a chip of an LED provided in this embodiment, the LED chip is constructed by using the N-type semiconductor layer 111 and the P-type semiconductor layer 112, the light-emitting layer 113 disposed between the N-type semiconductor layer 111 and the P-type semiconductor layer 112, the N electrode 116 disposed on the N-type semiconductor layer 111, and a P electrode 115 disposed on the P-type semiconductor layer 112.

Specifically, as shown in FIG. 1, the LED chip includes an N-type semiconductor layer 111 over which a P-type semiconductor layer is disposed. Since the LED chip provided in this embodiment is a flip chip, the LED chip disclosed in this embodiment has an inverted structure of the structure shown in FIG. 1 when packaged. An N electrode 116 is disposed on the N-type semiconductor layer 111, a P electrode 115 is disposed on the P-type semiconductor layer 112, a light-emitting layer 113 is disposed between the N-type semiconductor layer 111 and the P-type semiconductor layer 112, and a light emitted by the light-emitting layer 113 is emitted after being reflected.

Figure 4:
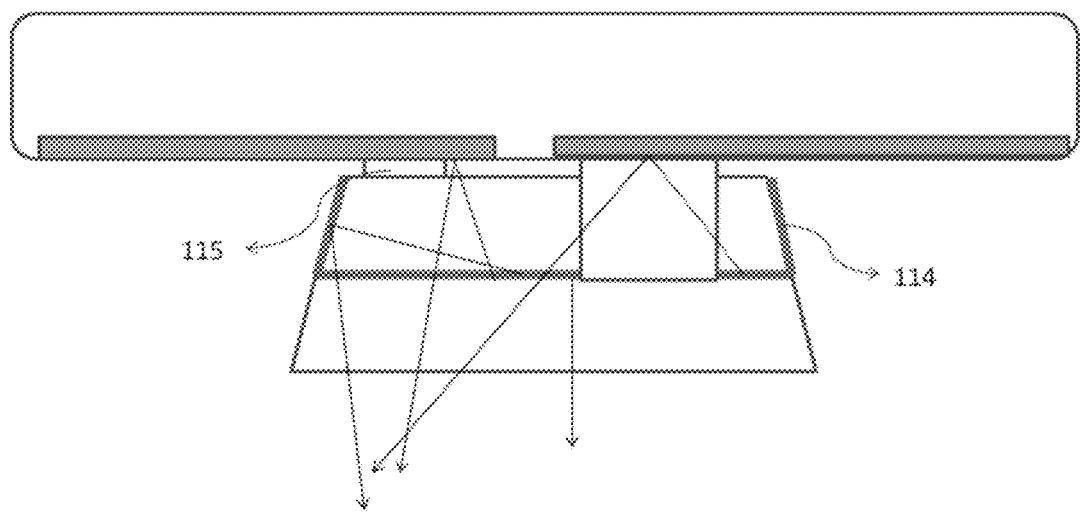
FIG. 4 is a light path diagram of lights emitted from a light-emitting layer in an LED chip according to an embodiment of the present disclosure.

In order to prevent a light beam emitted from the light-emitting layer 113 from being emitted from an outer surface of the side edge of the P-type semiconductor layer 112, in this embodiment, a reflecting layer 114 is disposed on the outer side surface of the P-type semiconductor layer 112, so that the light beam emitted onto the inner wall of the P-type semiconductor layer 112, as shown with reference to FIG. 4, passes through the light-emitting layer 113 and the N-type semiconductor layer 111 and is emitted to the lower surface of the LED. Thus, the lights emitted to the side edge is all reflected to have a same light direction, so that the light irradiated to the same direction is strengthened, the intensity of lights irradiated to the same direction is increased, and interference to adjacent LEDs is avoided.

Figure 2:
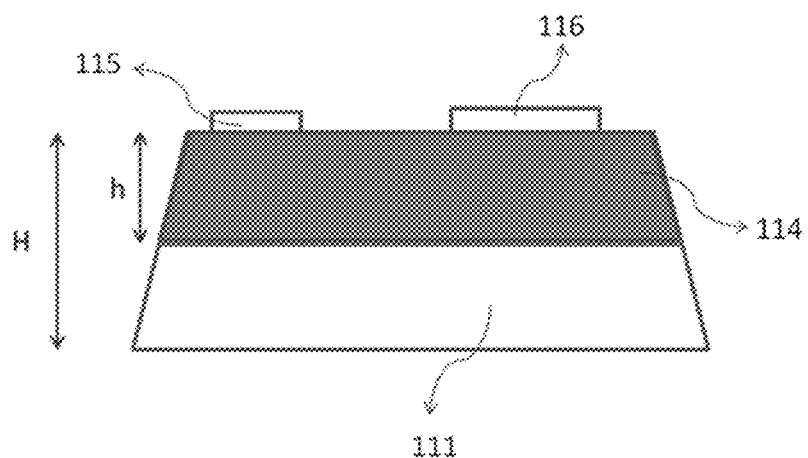
FIG. 2 is a second side view of an LED chip in an embodiment of the present disclosure.
Figure 3:
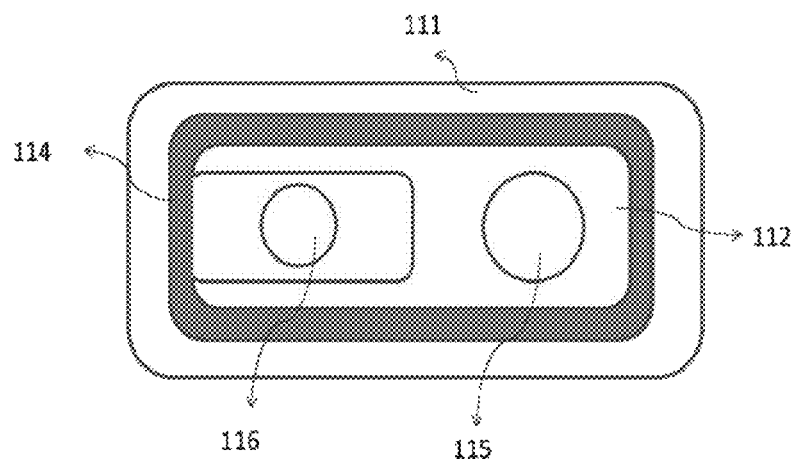
FIG. 3 is a top view of an LED chip in an embodiment of the present disclosure.
Figure 5:
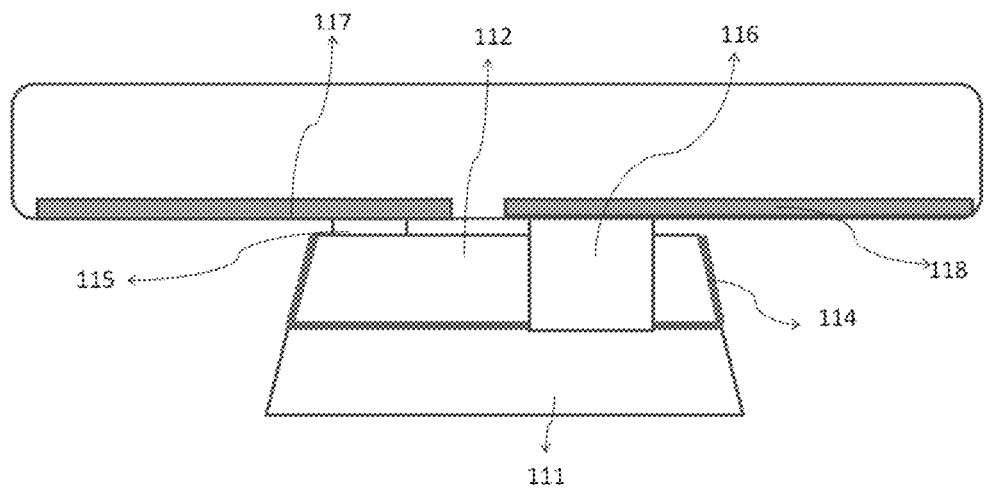
FIG. 5 is a cross-sectional view of an LED chip in an embodiment of the present disclosure.

Specifically, with reference to FIGS. 2 and 3, one side edge surface of the N electrode 116 is connected to one side edge surface of the P-type semiconductor layer 112, and the P-type semiconductor layer 112 is coated on the periphery of the other side edge surfaces of the N electrode 116. As can be seen from FIG. 2, the P-type semiconductor layer is disposed over the N-type semiconductor layer and surrounds the N electrode. With reference to FIG. 5, the P-type semiconductor layer 112 surrounds three faces of the N electrode 116, and the reflecting layer 114 covers the side edges of the P-type semiconductor layer 112 and the N electrode 116, so that light beams emitted to the inner walls of the side edge of the P-type semiconductor layer 112 or the N electrode 116 are emitted to a same plane by reflection of the reflecting layer 114.

In one example of this embodiment, a shape of the side edge composed of the N electrode 116, the P-type semiconductor layer 112, and the N-type semiconductor layer 111 is designed to be trapezoidal. Since the shape of the side edge composed of the N electrode 116, the P-type semiconductor layer 112, and the N-type semiconductor layer 111 is trapezoidal, and the side edges of the N electrode 116 and the P type semiconductor layer 112 are positioned on the upper half part of the trapezoid, a light reflected by the reflecting layer 114 passes through the light-emitting layer 113 and the N type semiconductor layer 111 and then is transmitted out of the lower surface of the trapezoid structure, so as to obtain a better light field directivity effect and a backlight source with higher quality.

In another example of this embodiment, it is also possible to obtain a better light reflection effect by designing a height of the reflecting layer, which is less than or equal to ½ of a value of a distance between the top of the P-type semiconductor layer 112 and the bottom of the N-type semiconductor layer 111, such that the emitting angle of the LED is about 145 degrees. In a specific implementation, the minimum height value of the reflecting layer 114 may be calculated based on an angle value between the side edge of the P-type semiconductor layer 112 and the upper or lower surface of the P-type semiconductor layer 112, the length value of the side edge of the P-type semiconductor layer 112, and the length value of the light-emitting layer 113, so that the light irradiated onto the reflecting layer can be reflected onto the lower surface of the N-type semiconductor layer 111.

In a specific implementation, since a nitride semiconductor such as a gallium nitride (GaN) semiconductor has high thermal stability and a wide band gap, the material of the N-type semiconductor layer 111 may be an N-type gallium nitride material obtained by doping a donor impurity in the gallium nitride material, and the material of the P-type semiconductor layer 112 may be a P-type gallium nitride material obtained by doping an acceptor impurity in the gallium nitride material. The material of the reflecting layer can also be made of gallium nitride material.

Embodiment 2

The embodiment also discloses an LED, which comprises the LED chip described above.

With reference to FIG. 4, the LED is disposed with the LED chip disclosed in the embodiment 1, a substrate which is respectively disposed below the LED chip and connected with the LED chip, and a circuit board disposed below the substrate. The substrate is disposed with an N electrode connector and a P electrode connector which are respectively connected with the N electrode and the P electrode on the LED chip.

Due to the fact that a reflecting layer is disposed on the LED chip of the LED, a light emitted by the LED can be intensively emitted to the front of the LED, so that the light field directivity of light beams emitted by a single LED is increased, the light emitted by the LED is easier to control, and the luminous intensity of the LED is improved. On the premise of the same luminance, more energy is saved.

Embodiment 3

In a third aspect, the embodiment also discloses an LED packaging method, which comprises covering an outer surface of the side edge of the second semiconductor layer of each LED by using a reflecting layer.

The embodiment of the disclosure also discloses a packaging method of LED, wherein a reflecting layer is coated on the outer surface of the side edge of the second semiconductor layer, so that light beams irradiated to the side edge of the second semiconductor layer are emitted to a given direction by reflection of the reflecting layer, thereby realizing regulation and control on the light emitted from the LED light-emitting layer.

The LED chip comprises a first semiconductor layer, a second semiconductor layer disposed on the first semiconductor layer, a light-emitting layer disposed between the first semiconductor layer and the second semiconductor layer, and a reflecting layer coated on an outer side of a side edge of the first semiconductor layer. The first semiconductor layer is a P-type semiconductor layer, the second semiconductor layer is an N-type semiconductor layer, and the both are connected to form a P-N junction. Light is emitted by injecting electrons into the P-N using an external power source. Disposed between the P-type semiconductor layer and the N-type semiconductor layer is a light-emitting layer. An N electrode is disposed on the N-type semiconductor layer; and the reflecting layer is also coated on an outer surface of a side edge of the N electrode.

Specifically, when the LED is packaged, an N-type semiconductor layer is provided with an N electrode, a P electrode is disposed for a P-type semiconductor layer, the N electrode is connected to the N-type semiconductor layer, and the P electrode is connected to the P-type semiconductor layer.

A light-emitting layer is disposed on the N-type semiconductor layer, wherein the light-emitting layer covers a part of the upper surface of the N-type semiconductor layer without including the N electrode.

A P-type semiconductor layer is disposed on the light-emitting layer, the P-type semiconductor layer covers an outer side surface of the N electrode, and the reflecting layer covers an outer surface of the P-type semiconductor layer.

Specifically, the N electrode may also be disposed on one side of the light-emitting layer parallel to one end plane of the light-emitting layer, so that the P-type semiconductor layer only needs to be covered on the other outer side surfaces of the N electrode at this time.

With reference to FIG. 5, for packaging the LED chip, the LED chip is connected with a substrate and the like, and then packaged in an LED lampshade to form the LED provided by the embodiment.

When the packaging is carried out, a ratio between the height value of the reflecting layer and the height value of the whole LED is required to be preset, and the reflecting layer extends from the P-type semiconductor layer to the N electrode. The emitted light beam of the LED is emitted from the light-emitting layer inside the LED, and a forward light field is intensively emitted by the reflecting layer. A height h between the reflecting layer and the LED substrate is required to be calculated according to a height H of the LED in order to meet the requirement that the light emitted by the light-emitting layer is intensively emitted to a forward light field. With reference to FIG. 2, in order to achieve the above object, the height h of the reflecting layer at a side edge is less than or equal to ½ of the height H of the LED such that the emitting angle of the LED is about 145 degrees. The different height of the reflecting layer can be respectively designed and the emission angle of the LED can be adjusted according to requirements of different light field directions.

Embodiment 4

Figure 6:
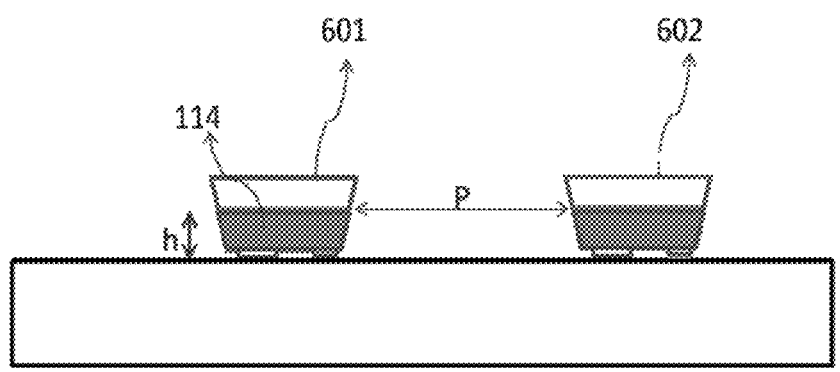
FIG. 6 is a schematic diagram of the relationship between the distance between each LED in a LED array and the height of a reflecting layer in an embodiment of the present disclosure.

On the basis that an LED is disclosed in the embodiment 2, the embodiment discloses an LED array, as shown in FIG. 6, comprising a circuit board and the LEDs described above mounted on the circuit board, as shown in FIG. 6, a first LED 601 and a second LED 602.

Due to the fact that the reflecting layer 114 is disposed on the LED chip of the LED, the light emitted by the LED can be intensively emitted to the front of the LED; the light emitted by adjacent LEDs cannot be interfered by the LED because no light is emitted from the side edge of the LED, so as to solve the problem that the interference is large due to the fact that the distance between the adjacent LEDs is short.

In order to avoid the problem of light interference MURA between each LED, it can be realized by two methods of increasing a distance between two LEDs and increasing a height of the reflecting layer in each LED chip; and in the embodiment, light interference between each LED is avoided by setting the distance between two adjacent LEDs and the height of the reflecting layer in each LED chip. Since the smaller the distance is between adjacent LEDs, the greater the interference is, in order to reduce the interference, in this embodiment the distance between any one of the LEDs and an adjacent LED is arranged in an inversely proportional relationship to the height of the reflecting layer wrapped on the LED chip body.

According to the LED array provided by the embodiment, the reflecting layer for emitting light regulation is added to the LED chip in each LED, so that the LEDs have higher light field directivity; and due to the fact that each LED has better light field directivity, when a plurality of the LEDs are packaged into the LED array, the phenomena of uneven display luminance and various traces of the LED array light source are reduced, and the luminance performance of the LED array is improved.

According to the LED, the LED array and the LED packaging method provided by the embodiment of the disclosure, by adding a reflecting layer on the periphery of the LED, the reflecting layer can adjust the emission direction of light emitted by the light-emitting layer of the LED, so that the adjusted emission direction is more concentrated to a certain required illumination direction, and the light emitted by the light-emitting layer is prevented from irradiating adjacent LEDs and thereby causing interference to the adjacent LEDs. Therefore, according to the method provided by the disclosure, the light field directivity of the emitted light beam is improved, the embodiment is easy to operate with convenient implementation, providing convenience for improving LED performance.

Other embodiments of the disclosure will be apparent to those skilled in the art from consideration of the description and practice of the disclosure disclosed herein. The present disclosure is intended to cover any variations, uses, or adaptations of the disclosure following the general principles of the disclosure and including common general knowledge or customary technical means in the art not disclosed in this disclosure. It is intended that the description and examples be considered as exemplary only, with a true scope and spirit of the disclosure being indicated by the following claims.

It should be understood that the disclosure is not limited to the precise constructions described above and shown in the drawings, and that various modifications and changes may be made without departing from the scope thereof. The scope of the disclosure is limited only by the accompanying claims.

What is claimed is:

1. An LED chip, comprising:
   an LED chip body comprising: an N-type semiconductor layer, a P-type semiconductor layer disposed over the N-type semiconductor layer, and a light-emitting layer disposed between the N-type semiconductor layer and P-type semiconductor layer, wherein an N electrode is disposed on the N-type semiconductor layer, and the P-type semiconductor layer surrounds three side faces of the N electrode; and
   a reflecting layer directly coated on a side edge surface of the P-type semiconductor layer and a side edge surface of the N electrode, the side edge surface of the N electrode coated with the reflecting layer being a fourth side face of the N electrode that is not covered by the P-type semiconductor layer;
   wherein a height of the reflecting layer is determined according to an angle between a side edge of the P-type semiconductor layer and an upper or lower surface of the P-type semiconductor layer, a length of the side edge of the P-type semiconductor layer, and a length of the light-emitting layer, a direction of the lengths being perpendicular to a direction of the height,
   a shape of a side edge surface composed of the N electrode, the P-type semiconductor layer and the N-type semiconductor layer is trapezoid, a top edge of the trapezoid being shorter than a bottom edge of the trapezoid; and
   the N electrode and the P type semiconductor layer are positioned on an upper half part of the trapezoid.

2. The LED chip according to claim 1, wherein one side edge surface of the N electrode is connected to one side edge surface of the P-type semiconductor layer, and the P-type semiconductor layer is coated on other side edge surfaces of the N electrode.

3. The LED chip according to claim 1, wherein a height of the reflecting layer is less than or equal to ½ of a value of a distance between a top of the second semiconductor layer and a bottom of the first semiconductor layer.

4. The LED chip according to claim 1, wherein a material of the first semiconductor layer is an N-type gallium nitride material, and a material of the second semiconductor layer is a P-type gallium nitride material.

5. An LED packaging method of an LED which comprises the LED chip according to claim 1, wherein comprising covering an outer surface of the side edge of the P-type semiconductor layer of each LED by using the reflecting layer.

6. An LED array, wherein comprising a circuit board and a plurality of LEDs which comprise the LED chip according to claim 1 mounted on the circuit board.

7. The LED array according to claim 6, wherein a distance between any one of the LEDs and an adjacent LED is inversely proportional to the height of the reflecting layer wrapped on the LED chip body.

* * * * *